United States Patent [19]

Cardinale

[11] Patent Number: 4,816,295

[45] Date of Patent: Mar. 28, 1989

[54] METHOD FOR IMPARTING AN APPARENT FINISH TO THE SURFACE OF AN ARTICLE

[75] Inventor: Emanuel Cardinale, Brooklyn, N.Y.

[73] Assignee: C.A.M. Graphics Co., Inc., Amityville, N.Y.

[21] Appl. No.: 483,185

[22] Filed: Apr. 8, 1983

Related U.S. Application Data

[63] Continuation-in-part of Ser. No. 280,343, Jul. 6, 1981, abandoned.

[51] Int. Cl.[4] .......................... B05D 3/06; G03C 1/68; G03F 7/00; B41M 1/12

[52] U.S. Cl. .................................... 427/54.1; 430/281; 430/301; 101/129

[58] Field of Search ............................. 427/54.1, 53.1; 430/281, 301; 101/129

[56] References Cited

U.S. PATENT DOCUMENTS

| | | | |
|---|---|---|---|
| 2,893,315 | 7/1959 | Reynolds et al. | 101/129 |
| 3,023,122 | 2/1962 | Pataky | 427/54.1 |
| 3,836,367 | 9/1974 | Klemm | 430/308 |
| 3,953,214 | 4/1976 | Lipsom et al. | 430/281 |

OTHER PUBLICATIONS

Pappas, "UV Curing: Science and Technology", Technology Marketing Corp., Stamford, Conn., (1978), pp. 188–193.

Bessemer, "Radiation Curing", May 1976, pp. 10, 11, 14, 16.

*Primary Examiner*—Michael Lusignan
*Assistant Examiner*—Marianne L. Padgett
*Attorney, Agent, or Firm*—Steinberg & Raskin

[57] ABSTRACT

A method for imparting an apparent finish to the surface of an article, i.e., a method for imparting both a visual and tactile appearance to the surface of an article that the surface itself has been finished using conventional mechanical or chemical techniques. The method includes the steps of preparing a printing screen having certain characteristics by exposing the screen covered with a photographic emulsion to art work illustrating the desired surface finish, locating the printing screen over the article surface to which the apparent finish is to be imparted, pressing a clear UV curable material having certain characteristics through the prepared screen onto the article surface, and substantially immediately curing the deposited material to impart the apparent finish to the surface.

10 Claims, No Drawings

METHOD FOR IMPARTING AN APPARENT FINISH TO THE SURFACE OF AN ARTICLE

BACKGROUND OF THE INVENTION

This application is a continuation-in-part of application Ser. No. 280,343 filed July 6, 1981 now abandoned.

The present invnetion relates to methods for imparting a desired finish to the surface of an article.

It is frequently desired to provide the surface of an article with a certain "finish" for aesthetic and other reasons. For example, plastic and metallic surfaces are frequently embossed, i.e., provided with a patterned relief, to achieve an ornamental appearance as well as a pleasing "feel". Surfaces of certain materials are often given an apparent textured or texturized finish, i.e., an appearance that the article is formed of a woven fabric. Other types of finishes often applied to surfaces includes so-called brushed finishes, burnished finishes, ground, honed or lapped finishes and the like.

All of these surface finishes are characterized by providing the surface with a certain patterned or random profile usually having a certain lay, i.e., direction of predominant surface pattern. In other words, the surface of the article is actually altered to provide surface irregularities therein. The irregularities constitute protuberances or recesses which extend slight distances above or below an average plane through the surface. For example, the irregularities defining certain types of finishes may have heights in the range of about 5 to 1,000 microinches. The particular finishes each have characteristic visual appearances as well as certain tactile "feel".

As noted above, conventional techniques for providing surfaces with a certain finish require that the contour of the surface itself be altered. Such surface alteration is generally accomplished using mechanical means or chemical means. For example, metallic and plastic sheet material is embossed by passing it through a pressure nip formed by press rolls in which the desired pattern is provided, the rolls deforming the surfaces of the sheet material. A textured appearance can be imparted to plastic sheet material in a similar manner. Machine finishing the surfaces, e.g., by honing, lapping and the like, also provides a distinctive surface finish. Moreover, in the case of plastic articles, a desired surface finish is often provided during the same injection molding process during which the article itself is formed.

The conventional techniques described above are not entirely satisfactory. Thus, all of the conventional techniques for providing a finish to the surface of an article are generally quite costly since they require relatively expensive equipmet and time-consuming operations.

Moreover, it is frequently desired to provide a so-called specialized finish in the surface, e.g., to provide a textured finish only to certain well-defined pre-selected areas of the surface of sheet material while leaving other areas unfinished, as where the sheet material comprises a membrane switch panel and a non-finished area is desired to accommodate a LED display or the like. In many cases this is difficult and often not possible using conventional finishing techniques. It may also be desired to provide different types of finishes on different areas of the article surface which is also difficult to achieve using conventional methods.

Finally, it is not possible to easily impart certain types of finishes to certain materials. For example, it is not practical to provide the surface of a metallic article with a textured finish with conventional techniques.

SUMMARY OF THE INVENTION

Accordingly, it is a general object of the present invention to provide a new and improved method for imparting a finish to the surface of an article.

It is a main object of the present invention to provide a new and improved method for imparting an apparent finish to the surface of an article, i.e., for imparting both a visual and tactile appearance to the surface of an article that the surface itself has been finished by forming slight irregularities therein by mechanical or chemical techniques while in fact not requiring any such physical alternation in the profile of the article surface.

It is also an object of the present invention to provide a new and improved method for imparting an apparent finish of practically any type to the surface of an article substantially regardless of the material from which the article is formed.

Still another object of the present invention is to provide a new and improved method for imparting an apparent finish to the surface of an article in only certain well-defined areas of the surface while leaving the other areas in apparent unfinished form.

A futher object of the present invention is to provide a new and improved method for imparting an apparent finish to the surface of an article wherein different types of finishes are provided on respective areas of the article surface.

A still further object of the present invention is to provide a new and improved method for imparting an apparent finish to the surface of an article which is relatively uncomplicated and economical.

Briefly, in accordance with the present invention, these and other objects are attained by providing a method for imparting an apparent finish to the surface of an article through the deposition of a preferably clear UV curable material onto the article surface using a specially adapted screen printing technique.

In this connection it will be understood that the terms "finish" or "surface finish" refer to the formation or appearance thereof of slight pattern or random irregularities in the surface of an article, the height of the irregularities being extremely small, e.g., in the range of between about 5–1,000 microinches, relative to the area of the surface on which it is formed.

More particularly, the applicant has found that the visual and tactile appearance of practically every type of finish can be imparted to the surface of an article by a method wherein a suitable UV curable material is deposited in a certain pattern on the article surface desired to be finished through an appropriate suitably prepared printing screen whereupon the deposited material is substantially immediately cured. The printing screen is initially prepared by exposing the screen which has been covered with a photographic emulsion to art work illustrating the desired surface finish so that on development the openings in certain pre-defined areas of the screen corresponding to the finish art work are left covered or blocked. With the screen preferably mounted on a frame and situated over the surface to which the apparent finish is to be imparted, a UV curable material such as a polymer with appropriate cross-linkable photoinitiators, is pressed through the unblocked screen openings and deposited on the article surface. The screen must be extremely thin and have a fine mesh so that the height of the UV curable material deposited on the surface corresponds to the slight height of the irregularities which characterize the particular desired finish.

The viscosity of the UV curable material must also be suitably chosen as described below. The deposited UV curable material is then substantially immediately cured by exposing the same to ultra-violet-visible light. The cured UV material imparts the visual and tactile appearance of a finish to the article surface which for all intents and purposes is identical to a finish which has been formed by altering the surface itself by mechanical or chemical means.

At first blush, it would not seem possible to impart on apparent finish to an article surface in the manner described above. The reason for this is that it has been presumed that when deposits of any type of curable material having the extremely small heights or thicknesses discussed above are applied to a surface, that such deposited material will sag or deform under its own weight prior to curing thereby making it impossible to achieve the well-defined appearance characteristics of surface finishes in general. However, the applicant has found that appropriate UV curable materials can be used which can be cured substantially immediately after being deposited onto the surface before the material has had a chance to deform under gravity to thereby retain the visual appearance and tactile feel of a surface finish.

It is preferred that a clear or unpigmented UV material be used so that the actual article surface will be visible through the deposited material. In this manner, the visual appearance, i.e., color, graphics, etc. of the underlying surface are retained.

According to the method of the invention the screen can be prepared with any desired pattern for the finish so that apparently unfinished surface areas or areas having different apparent finishes can be provided.

According to other features of the invention, a primer coating, such as a vinyl base material, may be applied to the surface prior to imparting the apparent finish thereto when the material of the article is not compatible with the particular UV curable material utilized. Moreover, a clear, smooth surface coating may be applied to the surface prior to imparting the apparent finish in order to provide a gloss thereto as well as resistance to abrasion.

DESCRIPTION OF THE PREFERRED EMBODIMENTS

The method of the present invention for imparting an apparent finish to the surface of an article generally includes the steps of depositing a suitable UV curable material on the surface by pressing the same through a suitably prepared fine mesh printing screen having certain characteristics and substantially immediately thereafter curing the deposited material to impart the apparent finish to the surface. Several embodiments of the method are disclosed below.

In all of the methods described below, an appropriate printing screen is first prepared. In order to provide that the deposited UV material when cured has a height or thickness which imparts to the surface the visual appearance and tactile feel of a finish formed by an actual alteration of the surface profile, it has been found that the mesh and wire or fiber diameter of the printing screen should lie substantially within certain respective ranges. For example, it has been found that a screen formed of polyester fibers having a diameter in the range of about 35 to 40 microns and having a mesh in the range of about 450 to 150 is suitable for use in the method of the invention. A polyester printing screen having a fiber diameter of 35 microns and 390 mesh is most suitable with heights of about 0.001 inches of deposited UV curable material being obtainable. A finer mesh than 450 is not appropriate since the viscosity of the UV curable material would have to be too low in this case in order to squeeze the material through the mesh. On the other hand, a coarser mesh than 150 would necessitate increasing the viscosity of the UV curable material to an unduly high value.

Printing screens formed of stainless steel wire having a diameter in the range of about 0.0010–0.0016 inches and of 500–250 mesh have also been found suitable. It will be understood that the viscosity of the UV curable material should be compatible with the paticular screen chosen, the viscosity being lower in the case of a finer mesh and greater in the case of a coarser mesh.

The printing screen is prepared in the following manner. An unexposed photosensitive film or emulsion in placed over the screen. Black and white artwork of the apparent finish to be imparted to the surface is photographed and the film situated over the screen and emulsion whereupon the film is developed to harden an image of the artwork onto the screen through the blockage of the mesh openings over certain regions of the screen. The screen is then washed to remove the exposed film from the screen. The screen is then preferably incorporated in a frame to constitute the bottom of a formed trough for receiving the UV curable material in a subsequent depositing step as described below.

A clear or unpigmented UV curable material is preferably used in the method of the invention and may constitute a so-called UV printing ink comprising a polymer in a vehicle system which includes photoinitiators which can cross-link when subjected to UV radiation. For example, a UV curing ink may comprise an oligomer or prepolymer, such as a urethane acrylate or a monomer, such as a mono-acrylate. The photoinitiators which absorb the ultraviolet energy and start the polymerization of the ink film may comprise an acyloin or acyloin ether, and possibly other additives, such as a stabilizer. The particular UV printing ink is chosen so as to have a rapid rate of curing as will be readily understood by those skilled in the art. Such UV curable materials are well known and are available, for example, from Advance Process Supply Company of Chicago, Ill.

As noted above, the UV curable material should have a viscosity which is compatible with the respective particular characteristics of the printing screen used. In the case of the use of a polyester mesh screen of 390 mesh with a fiber diameter of 35 microns, the UV curable material preferably has a viscosity of about 2,500 centipoise (Brookfield #6 at 72° F. and 10 rpm). For finer and coarser mesh screens, the viscosity should vary accordingly between about 1,500 centipoise to 4,000 centipoise.

For a good discussion of the technique of UV curing in general and the application of UV curable materials by a screen printing process in particular, reference is made to "UV Curing: Science and Technology," published by Technology Marketing Corporation of Norwalk, Conn.

The method of the invention is suitable for use in imparting an apparent finish to surfaces of articles formed of various materials such, for example, as treated polyester, vinyls, treated polycarbonates, steel, aluminum, zinc and magnesium, among others. Although some of these materials (e.g., vinyl) are compatible with the UV curable materials used in the process, it is necessary in the case of certain other less compatatible materials to first prepare the same by providing a primer coat to insure good adhesion of the UV curable material.

In a first embodiment of the invention wherein the article whose surface is to have the apparent finish imparted thereto is formed of a material which is compatible with the UV curable material, i.e., which will adhere well thereto, such for example as polyester sheet material, the printing screen having characteristics within the above-described ranges and prepared as described above is located over the article surface whereupon a preferably clear UV curable material having the characteristics described above is charged onto the screen and pressed therethrough onto the article surface, such as by passing a squeegee over the screen. In this connection, it will be understood that only an extremely thin deposit of UV curable material will be pressed through the open areas of the screen while the blocked screen areas will prevent UV curable material from being deposited on the screen in those regions underlying the blocked areas. The deposited material is then substantially immediately cured by exposing it to UV radiation. For example, the deposited material is cured within five seconds after it has been deposited on the polyester surface. In this manner the deposited material holds its shape to provide a well-defined apparent finish for the article surface. A longer curing time would allow the deposited material to sag or droop under its own weight which in the case of the extremely thin deposits which characterize the apparent finishes of the invention would destroy the appearance thereof.

It may be desired to provide the surface to which the apparent finish is to be imparted with a gloss or certain wear resistance. In this case, a clear, smooth protective coating of a UV curable material having a thickness of about 1 mil may first be applied over the surface using a conventional screen process with the screen being essentially entirely unobstructed. The UV material is then pressed through the prepared screen onto the clear smooth coating as described above to impart the apparent finish to the surface.

In an embodiment of the invention wherein the apparent finish is imparted to the surface of an article formed of a material which does not adhere well to the UV curable material, a primer coat is first applied to the surface to insure compatability with the UV curable material. For example, in order to apply an apparent embossed finish to the surface of sheet aluminum, a primer coat, which may have a thickness of about 1 mil and comprise a clear vinyl base material such for example as polyvinyl chloride acetate co-polymer, is first applied to the surface. A suitable UV curable material is then pressed through an appropriate printing screen prepared by the technique described above, including photographing artwork showing the desired embossed finish, onto the hardened primer coat and substantially immediately cured to impart the apparent finish. If desired, a protective coat may be applied to the primer coat prior to the deposition of the UV curable material. Moreover, it is understood that in the case where graphics or the like have been previously printed on the surface of the article, the imparting of the apparent finish using a clear UV curable material will not impair the visual appearance thereof.

Several important advantages are obtained by the method of the present invention. For example, an apparent finish can be applied to the surfaces of articles formed of most materials. The apparent finish applied is a relatively simple operation which is significantly more economical than conventional mechanical and chemical techniques. The apparent finish, or at least certain defined regions thereof, may have tight diffusing qualities so that by suitably preparing the printing screen, these light diffusing regions will become situated over windows to allow LED displays and the like to be situated beneath them. The apparent finish can be applied to only partial regions of the surface and virtually unlimited surface effects may be obtained using the method of the invention.

Obviously, numerous modifications and variations of the present invention are possible in the light of the above teachings. It is therefore to be understood that within the scope of the claims appended hereto, the invention may be practiced otherwise than as specifically disclosed herein.

I claim:

1. A method for imparting an apparent finish to the surface of an article, comprising the steps of:

preparing a fine mesh printing screen by hardening an image of a finish to be imparted to the surface onto the screen thereby blocking the openings in certain regions thereof;

locating the prepared printing screen over the article surface;

pressing a clear, unpigmented UV curable material through the unblocked openings of the prepared printing screen to deposit the UV curable material onto the article surface in a pattern of irregularities defining the apparent finish to be imparted to the surface, the irregularities having heights in the range of between about 5 to 1,000 microinches; and curing the deposited UV material by exposing the same to UV radiation substantially immediately after the material has been deposited onto the article surface to impart the apparent finish to the surface.

2. The method of claim 1 wherein prior to depositing the UV curable material onto the article surface, depositing a substantially smooth protective coating onto the surface.

3. The method of claim 1 wherein prior to depositing the UV curable material onto the article surface, depositing a primer coating onto the surface.

4. The method of claim 1 wherein the printing screen has a mesh in the range of between about 500 to 100.

5. The method of claim 4 wherein the printing screen is formed of polyester fibers and has a mesh in the range of between about 450 to 150.

6. The combination of claim 5 wherein the mesh of the screen is about 390.

7. The method of claim 4 wherein the printing screen is formed of stainless steel wire and has a mesh in the range of between about 500 to 250.

8. The method of claim 1 wherein the UV curable material has a viscosity in the range of between about 1,500 to 4,000 centipoise.

9. The method of claim 4 wherein the UV curable material has a viscosity in the range of between about 1,500 to 4,000 centipoise.

10. The method of claim 1 wherein the deposited UV curable material is cured within about 5 seconds after the same is deposited onto the article surface.

* * * * *